(12) United States Patent
Bibl et al.

(10) Patent No.: US 12,410,053 B1
(45) Date of Patent: Sep. 9, 2025

(54) EMBEDDED DIGITAL SENSOR STRUCTURE

(71) Applicant: Tacta Systems Inc., Palo Alto, CA (US)

(72) Inventors: Andreas Bibl, Los Altos, CA (US); Dariusz Golda, Portola Valley, CA (US); Patrick M. Smith, Palo Alto, CA (US)

(73) Assignee: Tacta Systems Inc., Palo Alto, CA (US)

( * ) Notice: Subject to any disclaimer, the term of this patent is extended or adjusted under 35 U.S.C. 154(b) by 0 days.

(21) Appl. No.: 18/960,184

(22) Filed: Nov. 26, 2024

Related U.S. Application Data

(63) Continuation of application No. 18/959,288, filed on Nov. 25, 2024.

(60) Provisional application No. 63/676,840, filed on Jul. 29, 2024.

(51) Int. Cl.
*B81B 7/00* (2006.01)
*B81C 1/00* (2006.01)
*G08B 6/00* (2006.01)

(52) U.S. Cl.
CPC ........ *B81B 7/0054* (2013.01); *B81C 1/00325* (2013.01); *B81B 2201/0264* (2013.01); *B81B 2203/0127* (2013.01); *B81B 2207/012* (2013.01); *B81B 2207/07* (2013.01); *B81C 2203/0154* (2013.01); *G08B 6/00* (2013.01)

(58) Field of Classification Search
CPC .......... B81B 7/0054; B81B 2201/0264; B81B 2203/0127; B81B 2207/012; B81B 2207/07; B81C 1/00325; B81C 2203/0154; G08B 6/00; Y10S 901/33; G05B 2219/40625; G05B 2219/40569; G01L 5/228; G09B 21/004
See application file for complete search history.

(56) References Cited

U.S. PATENT DOCUMENTS

| | | | |
|---|---|---|---|
| 4,668,861 A | 5/1987 | White | |
| 4,775,961 A | 10/1988 | Capek et al. | |
| 5,760,530 A | 6/1998 | Kolesar | |
| 6,593,756 B1 | 7/2003 | Shmidt et al. | |
| 7,168,748 B2 | 1/2007 | Townsend et al. | |
| 7,658,119 B2 | 2/2010 | Loeb et al. | |

(Continued)

OTHER PUBLICATIONS

"Learning the signatures of the human grasp using a scalable tactile glove," Subramanian Sundaram, Petr Kellnhofer, Yunzhu Li, Jun-Yan Zhu, Antonio Torralba & Wojciech Matusik; Nature, vol. 569; May 30, 2019; https://doi.org/10.1038/s41586-019-1234-z; 19 pages.

(Continued)

*Primary Examiner* — Moazzam Hossain
(74) *Attorney, Agent, or Firm* — Aikin & Gallant, LLP

(57) ABSTRACT

Embedded sensor structures and stretchable embedded sensor films including a plurality of embedded sensor packages are described. An embedded sensor structure may include a sensor package including an integrated circuit (IC) die and sensor die bonded to a front side of the IC die, with the sensor die including a diaphragm that is deflectable toward a cavity. A planarization layer laterally surrounds the sensor package, and metal routing is formed on a top side of the sensor die and spanning over the planarization layer. Other aspects are also described and claimed.

21 Claims, 11 Drawing Sheets

(56) References Cited

U.S. PATENT DOCUMENTS

| | | | |
|---|---|---|---|
| 7,673,528 | B2 | 3/2010 | Yoon et al. |
| 7,673,916 | B2 | 3/2010 | Greenhill et al. |
| 7,707,001 | B2 | 4/2010 | Obinata et al. |
| 7,878,075 | B2 | 2/2011 | Johansson et al. |
| 8,181,540 | B2 | 5/2012 | Loeb et al. |
| 8,272,278 | B2 | 9/2012 | Loeb et al. |
| 8,483,880 | B2 | 7/2013 | De La Rosa Tames et al. |
| 8,934,999 | B2 | 1/2015 | Kalayjian |
| 9,080,918 | B2 | 7/2015 | Loeb et al. |
| 9,381,645 | B1 | 7/2016 | Yarlagadda et al. |
| 9,415,517 | B2 | 8/2016 | Naidu et al. |
| 9,477,909 | B2 | 10/2016 | Loeb et al. |
| 9,613,180 | B1 | 4/2017 | Hoffmann et al. |
| 9,652,037 | B2 | 5/2017 | Rubin et al. |
| 9,904,358 | B2 | 2/2018 | Rubin et al. |
| 10,176,529 | B2 | 1/2019 | Amigo et al. |
| 10,222,859 | B2 | 3/2019 | Rubin et al. |
| 10,666,252 | B2 | 5/2020 | Frangen et al. |
| 10,732,711 | B2 | 8/2020 | Rubin et al. |
| 10,754,308 | B2 | 8/2020 | De Magistris et al. |
| 10,809,804 | B2 | 10/2020 | Goupil et al. |
| 10,824,282 | B2 | 11/2020 | Vallett et al. |
| 10,952,672 | B2 | 3/2021 | Flood et al. |
| 11,006,861 | B2 | 5/2021 | Di Pardo et al. |
| 11,009,949 | B1 | 5/2021 | Elias et al. |
| 11,061,472 | B2 | 7/2021 | Crockett et al. |
| 11,148,299 | B2 | 10/2021 | Yui |
| 11,162,858 | B2 | 11/2021 | Dade et al. |
| 11,221,263 | B2 | 1/2022 | Tsai et al. |
| 11,243,125 | B2 | 2/2022 | Tsai et al. |
| 11,243,126 | B2 | 2/2022 | Bergemont et al. |
| 11,255,737 | B2 | 2/2022 | Foughi et al. |
| 11,262,797 | B1 | 3/2022 | Hoen et al. |
| 11,267,126 | B2 | 3/2022 | Asano et al. |
| 11,287,340 | B2 | 3/2022 | Jiang et al. |
| 11,312,581 | B2 | 4/2022 | Huang et al. |
| 11,341,826 | B1 | 5/2022 | Wiley et al. |
| 11,371,903 | B2 | 6/2022 | Rogers et al. |
| 11,385,108 | B2 | 7/2022 | Diestelhorst et al. |
| 11,389,968 | B2 | 7/2022 | Alspach et al. |
| 11,400,587 | B2 | 8/2022 | Holly et al. |
| 11,413,748 | B2 | 8/2022 | Colasanto et al. |
| 11,423,686 | B2 | 8/2022 | Tsai et al. |
| 11,433,555 | B2 | 9/2022 | Smith et al. |
| 11,440,183 | B2 | 9/2022 | Huang et al. |
| 11,446,816 | B2 | 9/2022 | Goldberg et al. |
| 11,460,364 | B1 | 10/2022 | Chen |
| 11,460,919 | B1 | 10/2022 | Gashler et al. |
| 11,472,040 | B2 | 10/2022 | Yerazunis et al. |
| 11,534,923 | B1 | 12/2022 | De Arruda Camargo Polido |
| 12,103,182 | B1 | 10/2024 | Golda et al. |
| 2008/0218026 | A1* | 9/2008 | Pletner ............... H10N 30/88 |
| | | | 310/314 |
| 2009/0132088 | A1 | 5/2009 | Taitler |
| 2011/0083517 | A1* | 4/2011 | Muroyama ........... B25J 13/084 |
| | | | 73/862.046 |
| 2011/0094306 | A1 | 4/2011 | Bratkovski et al. |
| 2012/0065784 | A1 | 3/2012 | Feldman |
| 2012/0199921 | A1* | 8/2012 | Tanaka ................ B81C 1/00238 |
| | | | 438/51 |
| 2012/0247226 | A1* | 10/2012 | Muroyama ............ G01L 1/142 |
| | | | 73/862.046 |
| 2013/0204435 | A1 | 8/2013 | Moon et al. |
| 2013/0211579 | A1 | 8/2013 | Jian |
| 2013/0292793 | A1* | 11/2013 | Poucher ............... H01L 21/764 |
| | | | 438/421 |
| 2013/0345875 | A1 | 12/2013 | Brooks et al. |
| 2015/0357375 | A1 | 12/2015 | Tsai et al. |
| 2016/0025615 | A1 | 1/2016 | Fishel et al. |
| 2017/0086519 | A1 | 3/2017 | Vigano'et al. |
| 2018/0056520 | A1 | 3/2018 | Ozaki et al. |
| 2018/0107854 | A1 | 4/2018 | Tsai et al. |
| 2018/0290309 | A1 | 10/2018 | Becker et al. |
| 2019/0314998 | A1 | 10/2019 | Yui |
| 2019/0359424 | A1 | 11/2019 | Avraham |
| 2020/0070354 | A1 | 3/2020 | Nakayama et al. |
| 2020/0147644 | A1 | 5/2020 | Chang |
| 2020/0191704 | A1 | 6/2020 | Redmond et al. |
| 2021/0086364 | A1 | 3/2021 | Handa et al. |
| 2021/0122039 | A1 | 4/2021 | Su et al. |
| 2021/0293643 | A1 | 9/2021 | Correll et al. |
| 2021/0315485 | A1 | 10/2021 | Matusik et al. |
| 2021/0373663 | A1 | 12/2021 | Matusik et al. |
| 2022/0096187 | A1 | 3/2022 | Xu et al. |
| 2022/0221357 | A1 | 7/2022 | Elias et al. |
| 2022/0227006 | A1 | 7/2022 | Nabeto et al. |
| 2022/0250253 | A1 | 8/2022 | Nabeto et al. |
| 2022/0297287 | A1 | 9/2022 | Greenwald et al. |
| 2022/0316974 | A1 | 10/2022 | Gruebele et al. |
| 2022/0318459 | A1 | 10/2022 | Narang et al. |
| 2023/0226698 | A1 | 7/2023 | Chaki et al. |
| 2023/0341851 | A1 | 10/2023 | Liu et al. |

OTHER PUBLICATIONS

"Conformable amplified lead zirconate titanate sensors with enhanced piezoelectric response for cutaneous pressure monitoring," Canan Dagdeviren, Yewang Su, Pauline Joe, Raissa Yona, Yuhao Liu, Yun-Soung Kim, YongAn Huang, Anoop R. Damadoran, Jing Xia, Lane W. Martin, Yonggang Huang & John A. Rogers; Nature Communications; 5:4496; DOI: 10.1038/ncomms5496; www.nature.com/naturecommunications; Aug. 5, 2014; 42 pages—additional supplementary figures included.

"Performance Metrics and Test Methods for Robotic Hands," Joe Falco, Karl Van Wyk & Elena Messina; Natl. Inst. Stand. Technol. Draft Spec. Publ. 1227; 65 pages; Oct. 2018; Coden: NSPUE2; https://doi.org/10.6028/NIST.SP.1227-draft; 77 pages.

"Tactile and Vision Perception for Intelligent Humanoids," Shuo Gao, Yanning Dai, & Arokia Nathan; Adv. Intell. Syst. 2022, 4, 2100074; Advanced Intelligent Systems published by Wiley-VCH GmbH; DOI: 10.1002/aisy.202100074; 28 pages.

"Learning Hand-Eye Coordination for Robotic Grasping with Deep Learning and Large-Scale Data Collection," Sergey Levine, Peter Pastor, Alex Krizhevsky & Deirdre Quillen; arXiv:1603.02199v4 [cs.LG] Aug. 28, 2016; 12 pages.

"Development of a High-speed Multifingered Hand System and Its Application to Catching," Akio Namiki, Yoshiro Imai, Masatoshi Ishikawa & Makoto Kaneko; Proceedings of the 2003 IEEE/RSJ Intl. Conference on Intelligent Robots and Systems; Las Vegas, Nevada; Oct. 2003; pp. 2666-2671.

"Near static strain measurement with piezoelectric films," Arun K. Ramanathan, Leon M. Headings & Marcelo J. Dapino; ScienceDirect Sensors and Actuators A: Physical; journal homepage: www.elsevier.com/locate/sna; 301 (2020) 111654; NSF IUCRC on Smart Vehicle Concepts, Department of Mechanical and Aerospace Engineering, The Ohio State University, USA; Received Aug. 1, 2019; Available online Nov. 17, 2019; 11 pages.

"Learning Object Manipulation with Dexterous Hand-Arm Systems from Human Demonstration," Philipp Ruppel & Jianwei Zhang; 2020 IEEE/RSJ International Conference on Intelligent Robots and Systems (IROS); Oct. 25-29, 2020; Las Vegas, NV, USA (Virtual); DOI: 10.1109/IROS45743.2020.9340966; 8 pages.

An Embedded, Multi-Modal Sensor System for Scalable Robotic and Prosthetic Hand Fingers; Pascal Weiner, Caterina Neef, Yoshihisa Shibata, Yoshihiko Nakamura & Tamim Asfour; Sensors 2020, 20, 101; doi:10.3390/s20010101 www.mdpi.com/journal/sensors; 22 pages.

Huang et al.; "A Low-Noise and Monolithic Array Tactile Sensor Based on Incremental Delta-Sigma Analog-to-Digital Converters;" Electronics 2022, 11, 1206; https://doi.org/10.3390/electronics11081206; 14 pgs.

Jiang et al.; "Monolithic Ultrasound Fingerprint Sensor," Microsystems & Nanoengineering (2017) 3, 17059; doi: 10.1038/micronano.2017. 59; Published online: Nov. 20, 2017; www.nature.com/micronano; 8 pages.

(56) References Cited

OTHER PUBLICATIONS

Tsai et al.; "Versatile CMOS-MEMS integrated piezoelectric platform;" 1InvenSense Inc., San Jose California USA; Transducers 2015, Anchorage, Alaska, USA, Jun. 21-25, 2015; 5 pages.

* cited by examiner

EMBEDDED DIGITAL SENSOR STRUCTURE

RELATED APPLICATIONS

This application is a continuation of co-pending U.S. patent application Ser. No. 18/959,288, filed Nov. 25, 2024, which claims the benefit of priority from U.S. Provisional Patent Application Ser. No. 63/676,840 filed on Jul. 29, 2024, the full disclosures of which are incorporated herein by reference.

BACKGROUND

Field

Embodiments described herein relate to sensor arrays, and more particularly to embedded sensor arrays.

Background Information

Tactile sensor arrays continue to attract attention due to a variety of potential applications such as human-machine interaction, robotics, wearable healthcare devices, and augmented/virtual reality. Generally, the sensor arrays can be arranged in certain geometric configurations or patterns to collect information over a wide area and in multiple dimensions of an environment. Sensing over a large area can be particularly important for realizing artificial tactile sensations. A variety of types of sensors can be implemented depending upon the particular application. For example, piezoelectric sensors can utilize the piezoelectric effect to detect changes in pressure, acceleration, temperature, or strain by converting such detections to an electrical charge. In another example, capacitive sensors can utilize capacitive sensing to detect an object in proximity that may be conductive or may have a dielectric constant that is different from air.

A variety of techniques can be implemented to realize sensor arrays, such as forming capacitors or piezoresistive material arrays directly onto a substrate, lamination, or alternatively transferring discrete sensors or arrays of sensors to a substrate.

SUMMARY

Embedded sensor structures and deformable, stretchable embedded sensor films including a plurality of sensor packages are described which include a plurality, or array, of microfabricated sensor dies bonded to microfabricated mixed signal processing integrated circuit (IC) dies, a flexible polymer leveling or planarization layer, metal routing, and optionally an encapsulant to protect the metal routing and the sensor packages. The structure includes patterned strain relief trenches in the planarization layer to facilitate stretchability and flexibility after being released from a fabrication substrate such as a glass wafer or panel. Thin metal routing applied to the top of the planarization layer is designed to flex with the polymer planarization layer during applied strain while maintaining electrical connectivity to the stacked sensor array. In an embodiment an embedded sensor structure includes a sensor package and a planarization layer laterally surrounding the sensor package. The sensor package includes an integrated circuit (IC) die with a front side and a back side, and a sensor die including a top side and a bottom side that is bonded to the front side of the IC die. The sensor die additionally includes a diaphragm that is deflectable toward a cavity. In accordance with embodiments the embedded sensor structure additionally includes a metal routing to the top side of the sensor die, the metal routing spanning over the planarization layer.

A variety of sensor dies may be provided. For example, the sensor die can include a strain response material on the diaphragm, and between the diaphragm and the IC die. The sensor die may be fabricated in a variety of ways. For example, the sensor die can include a silicon substrate, and a plurality of via interconnects that electrically couple the IC die and the strain response material layer to the metal routing on the top side of the sensor die. In some embodiments, the sensor dies and sensor packages can be micro sized. For example, the sensor dies and sensor packages may have a maximum lateral dimension of 300 µm or less. The IC dies may additionally include analog front end (AFE) circuitry to amplify and filter analog signals derived from the strain response material layer upon deflection of the diaphragm, and an analog to digital converter (ADC). Furthermore, an encapsulant material protrusion can be provided directly over the sensor package to provide a localized contact surface. Each of these features of micro sized sensors and sensor packages, location of AFE and ADC circuitry at the point of measurement, and the localized contact surface can contribute to the assembly of array of fine pitch sensor arrays and highly sensitive sensors that may replicate human-scale tactile sensing.

The embedded sensor structures can also be designed for flexibility to replicate human-scale touch, grasp and/or dexterity. In accordance with embodiments, a pattern of strain relief trenches can be formed through the planarization layer in a variety of patterns. The strain relieve trenches can form a variety of flexible arms, such as in serpentine patterns, laterally adjacent to the sensor packages. Furthermore, the metal routing can span over one or more of the plurality of flexible arms, or serpentine patterns. Together, the planarization layer, sensor package, and metal routing can be part of a stretchable embedded sensor film that can be coupled with an article such as a glove, upholstery, a sleeve, a shoe, etc.

In an embodiment, a stretchable embedded sensor film includes a plurality of sensor packages embedded in a planarization layer laterally surrounding the plurality of sensor packages and metal routing spanning over the planarization layer and the top sides of the plurality of sensor dies of the sensor packages. A plurality of separate encapsulant material protrusions may also be formed directly over the plurality of sensor packages to provide localized contact surfaces. The sensor packages of the plurality of sensor packages have maximum lateral dimensions and pitch to match a particular sensitivity. In an embodiment, the stretchable embedded sensor film is designed to replicate human-scale tactile sensing. For example, the sensor packages of the plurality of sensor packages may be arranged with a pitch of 2 mm or less, with each sensor package having a maximum lateral dimension of 1,000 µm or less, though other pitches and sizes are contemplated. The strain relief trenches formed through the planarization layer may form a plurality of hub platforms in the planarization layer laterally surrounding the plurality of sensor packages, and a plurality of flexible arms extending from the plurality of hub platforms. Metal routing can additionally span over one or more of the plurality of flexible arms for each sensor package. The stretchable embedded sensor film may optionally have an underlying adhesive layer and/or support substrate that may also be flexible, and be used for integrating with an article. In one configuration, separate adhesive layers are located underneath each sensor package, and the planarization layer laterally surrounds each separate adhesive layer.

In an embodiment an article includes an article surface, a plurality of stretchable embedded sensor films attached to the article surface, a controller, and wiring connecting the plurality of embedded sensor films to the controller. In accordance with embodiments, each stretchable embedded sensor film can include a plurality of sensor packages embedded in a planarization layer laterally surrounding the plurality of sensor packages. The plurality of stretchable embedded sensor films may include a first stretchable embedded sensor film including a first plurality of sensor packages embedded in a first planarization layer, and a second stretchable embedded sensor film including a second plurality of sensor packages embedded in a second planarization layer. The first plurality of sensor packages can be arranged with the same, or smaller pitch than the second plurality of sensor packages, for example. In an exemplary implementation of a glove, the first stretchable embedded sensor film may be attached to a finger region of the article surface, and the second stretchable embedded sensor film may be attached to a palm region of the article surface. In this manner higher sensitivity can be provided at the finger region compared to the palm region. For example, the first plurality of sensor packages can be arranged with a pitch of 2 mm or less or 1 mm or less, and the second plurality of sensor packages can be arranged with a pitch of greater than 2 mm or greater than 1 mm, though different pitches are contemplated. Additional sensor or components can also be integrated into the stretchable embedded sensor films. For example, the palmar side second stretchable embedded sensor film can include one or more cameras embedded within the second planarization layer. The sensor packages can also have constant or variable pitches across the stretchable embedded sensor films. In some embodiments the controller may be directly connected to and interact directly with the plurality of stretchable embedded sensor films. In other embodiments, separate local controllers can be connected with separate stretchable embedded sensor films or groups thereof. The controller may then be connected with the local controllers, or even a specified set of one or more stretchable embedded sensor films.

The stretchable embedded sensor films can be assembled and connected with the metal routing using a variety of techniques. In an embodiment a method of forming a stretchable embedded sensor film includes applying an adhesive layer to a carrier substrate, placing a plurality of sensor packages onto the carrier substrate, applying planarization layer over the carrier substrate and laterally surrounding the plurality of sensor packages, forming metal routing on top side of the plurality of sensor packages and spanning over the planarization layer, and forming a pattern of strain relief trenches through the planarization layer. This may be followed by removal of the carrier substrate. Furthermore, encapsulant material protrusions can be formed over the plurality of sensor packages to provide localized contact surfaces. This can also be followed by depositing an encapsulation layer over the plurality of encapsulant material protrusions, the metal routing, the planarization layer, and within the pattern of strain relief trenches. In a particular configuration, the pattern of strain relief trenches forms a plurality of serpentine patterns in the planarization layer laterally adjacent to the plurality of sensor packages, and the metal routing spans over one or more of the plurality of serpentine patterns. In an embodiment, the sensor packages of the plurality of sensor packages are arranged with a pitch of 2 mm or less, and each sensor package has a maximum lateral dimension of 1,000 µm or less, though other pitches and dimensions are contemplated.

In an embodiment, a method of forming a stretchable embedded sensor film includes applying an adhesive layer to a carrier substrate, placing a plurality of sensor packages onto the carrier substrate, each sensor package including a plurality of stud bumps protruding from a top surface of the sensor package, applying planarization layer over the carrier substrate and laterally surrounding the plurality of sensor packages, treating the planarization layer to expose the plurality of stud bumps for each sensor package, and forming metal routing on top side of the plurality of sensor packages and spanning over the planarization layer. The planarization layer can also be patterned to expose plurality of sensor packages, which may optionally be followed by formation of a plurality of encapsulant material protrusions over the exposed sensor packages. In an embodiment, treating the planarization layer to expose the plurality of stud bumps includes plasma cleaning. In some embodiments a pattern of strain relief trenches is formed through the planarization layer, followed by removal of the carrier substrate. For example, the pattern of strain relief trenches can form a plurality of serpentine patterns in the planarization layer laterally adjacent to the plurality of sensor packages, and the metal routing spans over one or more of the plurality of serpentine patterns. In an embodiment, an encapsulation layer is deposited after forming the metal routing, and the carrier substrate is then removed. In an embodiment, the sensor packages of the plurality of sensor packages are arranged with a pitch of 2 mm or less, and each sensor package has a maximum lateral dimension of 1,000 µm or less, though other pitches and dimensions are contemplated.

In an embodiment, a method of forming a stretchable embedded sensor film includes applying an adhesive layer to a carrier substrate, placing a plurality of sensor packages onto the carrier substrate, applying a planarization layer over the carrier substrate and laterally surrounding the plurality of sensor packages, patterning the planarization layer to expose the plurality of sensor packages, and forming metal routing on top side of the plurality of sensor packages and spanning over the planarization layer. In some embodiments a pattern of strain relief trenches is formed through the planarization layer, followed by removal of the carrier substrate. For example, the pattern of strain relief trenches can form a plurality of serpentine patterns in the planarization layer laterally adjacent to the plurality of sensor packages, and the metal routing spans over one or more of the plurality of serpentine patterns. In an embodiment, an encapsulation layer is deposited after forming the metal routing. In an embodiment, the sensor packages of the plurality of sensor packages are arranged with a pitch of 2 mm or less, and each sensor package has a maximum lateral dimension of 1,000 µm or less, though other pitches and dimensions are contemplated.

DETAILED DESCRIPTION

Figure 1:
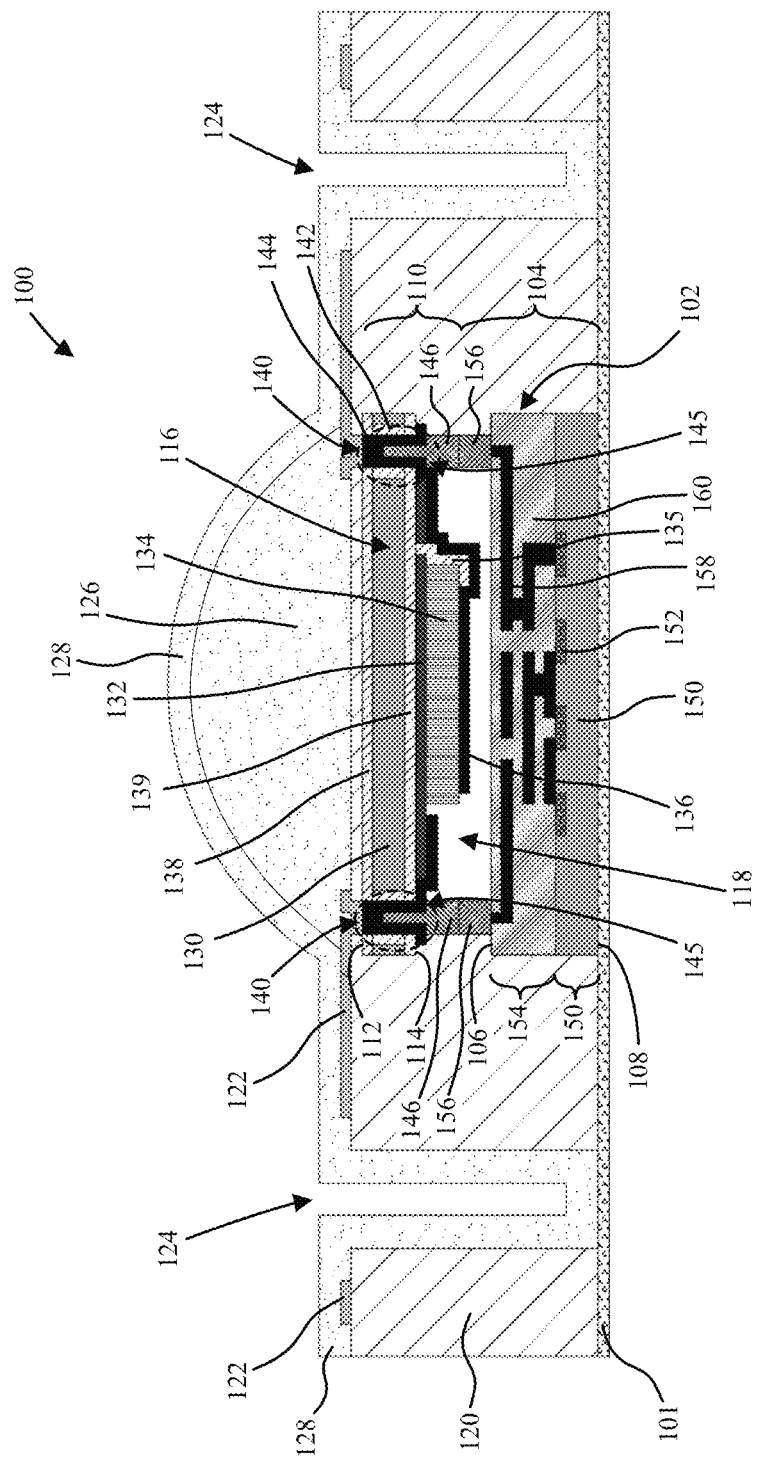
FIG. 1 is a schematic cross-sectional side view illustration of an embedded sensor structure in accordance with an embodiment.

Embodiments describe embedded sensor structures, deformable, stretchable embedded sensor films, and methods of assembly. In an embodiment, an embedded sensor structure includes a sensor package, a planarization layer laterally surrounding the sensor package, and a metal routing to top sides of the sensor package, the metal routing also spanning over the planarization layer. Depending upon the particular arrangement, the metal routing can include a plurality of common electrical trace routings such as $V_{DD}$ (power), $V_{SS}$ (ground, low power), clock, select (e.g., digital input (e.g., to trigger a readout of a sensor), and/or digital output (e.g., 8 bits, 12 bits, or more, representing sensing performed by the sensor at a given time). The sensor packages in accordance with embodiments can include a stacked configuration of an integrated circuit (IC) die including front side and a back side, and a sensor die including a top side and a bottom side that is bonded to the front side of the IC die. Thus, the metal routing may be to the top side of the sensor die and spanning over the planarization layer. The sensor die additionally can include a diaphragm that is deflectable toward a cavity. For example, the cavity may be between the IC die and the sensor die or be contained within the sensor die.

The sensor die in accordance with embodiments may include a strain response material, such as a piezoelectric material, on the diaphragm and between the diaphragm and the IC die. In this manner the strain response material can be physically shielded. The IC die may include various mixed signal circuitry. For example, the IC die can include analog front end (AFE) circuitry to amplify and filter analog signals derived from the strain response material layer upon deflection of the diaphragm, and an analog to digital converter (ADC). The sensor packages and IC dies thereof may additionally include address circuitry to define unique addresses for each sensor in an array of serially arranged sensor packages. In some embodiments the sensor packages can be serially connected with a data output and generate a serial bit stream (corresponding to the sensor readings) that may be read by a controller. In some embodiments the sensor packages can be connected in parallel, such as an array of rows and columns, with multiple data outputs (corresponding to multiple sensor readings) that may be read by a controller at the same time.

A pattern of strain relief trenches can also be formed through the planarization layer to facilitate stretchability and flexibility. For example, the pattern of strain relief trenches can form a plurality of flexible arms in the planarization layer laterally adjacent to the sensor package. The flexible arms can assume a variety of patterns for flexibility and stretchability such as serpentine or other circuitous or meandering patterns. In such configurations the metal routing spans over the plurality of serpentine patterns. In this manner, the metal routing and patterned planarization layer can be designed to flex in response to applied strain while maintaining electrical connectivity to the sensor package. The strain relief trenches or cutouts between the sensor packages may enable deformation of the sensor array with various articles.

In accordance with embodiments a plurality of embedded sensor structures can be incorporated into an embedded sensor film, for example where a plurality of sensor packages is embedded in the planarization layer. Pluralities of strain relief trenches and metal routings can be formed electrically connecting the plurality of sensor packages. Furthermore, the pluralities of strain relief trenches can physically provide a web-like structure to the deformable, stretchable embedded sensor films. In application, such stretchable embedded sensor films can be coupled to various articles such as, but not limited to, gloves, upholstery, sleeves, shoes, chairs, etc. In some cases, such stretchable embedded sensor films may be integrated with large area tactile input surfaces, such as a curved vehicle dashboard having software-reconfigurable buttons, switches, and/or dials.

In one aspect, the sensors in accordance with embodiments can be diaphragm-type pressure sensors (or transducers) in which an integrated diaphragm can be deflected during operation. Deflection in turn can transfer stress to a strain response material layer from which an electrical charge is measured. For example, the strain response material layer can be a piezoelectric material layer, a dielectric material layer for capacitive sensing, or strain gauge material layer such as a metal trace or pattern. The sensors described herein can be discrete sensor dies or may be sensor packages in which a sensor die is stacked on top of an IC die for signal conditioning. For example, the IC die may include circuitry such as analog front end (AFE) circuitry and/or an analog to digital controller (ADC). Such a stacked configuration can reduce overall area, integrate the diaphragm configuration into the stacked configuration, and reduce distance between the IC die and sensor die, potentially reducing latency and signal loss.

In another aspect, it has been observed that sensor requirements for certain tactile sensing applications used to replicate human-scale tactile sensing, touch, grasp and/or dexterity can require fine pitch sensor arrays and highly sensitive sensors. For example, humans can resolve objects as being spatially separate when they are ≥2 mm apart (e.g., Meissner corpuscles at the fingertips). As such, the sensor array disclosed herein may include sensors configured at 2x this spatial frequency (e.g., 1 mm pitch) or more, enabling the sensor array to also resolve objects that are 2 mm spacing (or less). In accordance with embodiments, the sensor dies or sensor packages may be microfabricated and have maximum lateral dimensions, for example, in a range of 1,000 μm or less such as 100 to 1,000 μm, or more specifically, 300 μm or less such as 100 to 300 μm, per side edge. Sample rate of the sensors (e.g., via controllers and/or other circuitry) can be at a rate that is faster than humans performing the tasks, and dynamic ranges of the sensors may exceed that of human touch. It has been additionally observed however, that both sensors and readout circuitry coupled with the sensors can be susceptible to significant parasitic effects. In accordance with some embodiments, integrated sensor packages can include both a sensor die and an IC die for signal conditioning and digitization. The IC die may include circuitry such as AFE circuitry and/or an ADC and may additionally include address circuitry to define unique addresses for each sensor in the sensor array. In highly sensitive applications requiring precise coordination of various sensors, such as tactile sensor arrays, the AFE circuitry may amplify and filter the analog signals derived from the sensor die for processing by the ADC, thereby increasing signal strength and reducing noise. The ADC converts the analog signals to digital signals. Integration of AFE and/or ADC circuitry close to each sensor die may reduce latency and signal loss, facilitating sensitivity necessary to replicate human-scale tactile sensing.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

As used herein, the term "circuitry" refers to an arrangement of electronic components (e.g., transistors, resistors, capacitors, and/or inductors) that is structured to implement one or more functions. For example, a circuit may include one or more transistors interconnected to form logic gates that collectively implement a logical function.

Referring now to FIG. 1 a schematic cross-sectional side view illustration is provided of an embedded sensor structure 100 in accordance with an embodiment. As shown, the embedded sensor structure 100 can include a sensor package 102 including an IC die 104 including a front side 106 and a back side 108, and a sensor die 110 including a top side 112 and a bottom side 114 that is bonded to the front side 106 of the IC die 104. In some embodiments the sensor die 110 additionally includes a diaphragm 116 that is deflectable toward a cavity 118 between the IC die 104 and the sensor die 110. Alternatively, cavity 118 can be contained within the sensor die. The cavity 118 and diaphragm thereover may be a variety of shapes such as, but not limited to, circular (top view) depending upon application. The diaphragm and cavity can be assembled using a variety of fabrication techniques. As described in further detail the diaphragm may be multilayered. As shown, a planarization layer 120 laterally surrounds the sensor package such that the sensor package is embedded in the planarization layer 120, and metal routing 122 is formed on the top side 112 of the sensor package and spans over the planarization layer 120 to electrically connect the sensor package 102 with controlling electronics (see also FIG. 2). As shown the planarization layer 120 and the sensor package 102 can be attached to an adhesive layer 101. The planarization layer may provide a level surface and step coverage for the metal routing. Additionally, the planarization layer may be removed from over the sensor package 102 or be sufficiently thin where it spans directly over the sensor region of the sensor package in order to minimize added stiffness to the sensor. For example, thickness of the planarization layer 120 directly over diaphragm 116 may be less than 10 microns thick.

The metal routing 122 may be formed of a suitable metal such as copper and gold for low resistivity, high ductility and ability to withstand large strain. The planarization layer 120 may be rendered flexible by selection of suitable materials such as polymer, and the formation of a pattern of strain relief trenches 124 (e.g., cutouts) through the planarization layer 120. The strain relief trenches 124 may terminate on the optional adhesive layer 101 or optional support substrate, or alternatively extend through the optional adhesive layer or optional support substrate. A variety of patterns may be implemented. For example, the strain relief trenches 124 can be shaped to form a plurality of serpentine patterns, zigzags or other shapes in the planarization layer laterally adjacent to the sensor package 102. Each serpentine pattern may thus be an arm extending from and connecting the sensor package. The metal routing 122 then spans over one or more of the plurality of serpentine patterns. Together, the planarization layer 120, sensor package 102 and the metal routing 122 can be part of a larger stretchable embedded sensor film including a plurality of sensor packages, and optionally different types of sensors/packages. The stretchable embedded sensor film can then be coupled with an article, such as a wearable device (e.g., a glove, sleeve, or shoe) or other system providing localized control (e.g., a seat or dashboard).

Still referring to FIG. 1, an encapsulant material protrusion 126 can optionally be formed directly over the sensor package to provide a localized contact surface. For example, the encapsulant material protrusion can be in the shape of a half-ball or other suitable shape. This can help both focus external pressure applied to the sensor region (e.g., diaphragm 116), as well as distribute the applied force. The encapsulant material may be formed of a material with a low modulus of elasticity, such as urethane, silicone, or equivalent polymer, for example. An encapsulation layer 128 can also be globally deposited over the optional encapsulant material protrusion 126, planarization layer 120, metal routing 122, and within the strain relief trenches 124 to provide additional mechanical and electrical protection, for example, for the metal routing 122.

The sensor dies 110 in accordance with embodiments can be designed for various performance. The sensor dies can include multiple different types of sensing elements, and different types of sensor dies can be embedded within the planarization layer as part of a stretchable embedded sensor film. For example, sensor dies can be designed for piezoelectric, capacitive, piezoresistive, temperature, or optical sensing. In the particular embodiment illustrated in FIG. 1 the sensor die is a diaphragm-type pressure sensor (or transducer) in which an integrated diaphragm can be deflected during operation though embodiments are not so limited. As shown, the sensor die 110 can include a support layer 130, an upper electrode layer 132, a strain response material layer 134, and a lower electrode layer 136. The lower electrode layer 136 may cover a surface area of the strain response material layer 134 so that the strain response material layer 134 is sandwiched between the upper electrode layer 132 and the lower electrode layer 136. An insulator layer 135, such as an oxide (e.g., silicon oxide), alumina or a nitride, can also be formed along a side of the strain response material to prevent electrical shorting between the electrode layers. Suitable piezoelectric materials for the strain response material layer 134 may include ceramics, wide bandgap semiconductors or polymers. Exemplary materials include lead zirconate titanate (PZT), barium titanate, and lead titanate, gallium nitride, zinc oxide, and polyvinylidene fluoride (PVDF). Both the upper electrode layer 132 and the lower electrode layer 136 may be formed of suitable materials such as metal, and may be multi-layer metal stacks. It is to be appreciated that while the particular configuration illustrated can be for a piezoelectric strain response material layer, a similar configuration can be utilized for capacitive sensing. A sandwich configuration may not be needed for strain gauge configurations, where the upper electrode layer and lower electrode layer can be replaced with suitable electrode terminals at ends of a metal trace or pattern.

The support layer 130 can be formed of a variety of materials, including glass, ceramics, silicon, etc. In accordance with embodiments wafer-level processing with silicon-based wafers can be used to leverage existing equipment and materials systems. For example, the support layer 130 can be a silicon substrate. In the particular embodiment illustrated, the support layer 130 can optionally be electrically insulated with top side passivation layer 138 and bottom side passivation layer 139, such as silicon oxide, which can be thermally grown or deposited.

A plurality of via openings 140 may also be formed through the support layer 130 in order to provide electrical connection to the top side 112. As shown, the via opening 140 sidewalls can be lined with an insulation liner 142, such as silicon oxide or other suitable insulating material. Conductive via liner layers 144 may be deposited within the via openings 140 for electrical connection with metal routing 122. Via liner layers 144 may be formed of any suitable metal for example. The remainder of the via openings may optionally be filled with a bulk material also used to form electrical contact terminals 146. For example, the electrical contact terminals 146 may be vertical interconnects, and pillar-shaped. In an embodiment, electrical contact terminals 146 are plated gold. Together the via liner layers 144 and bulk material may form via interconnects 145 through the support layer 130. It is to be appreciated that via interconnects 145 could also be formed using metal plugs or other materials including polysilicon plugs within the via openings, etc.

In accordance with embodiments the plurality of electrical contact terminals 146 can be used for direct connection with the IC die 104 and/or for connection to the strain response material layer 134. In such a configuration metal routing may electrically connect the upper electrode layer 132 to the via liner layer 144, or electrically connect the lower electrode layer 136 to the via liner layer 144. The metal routing may be formed separately form, or as the same film(s) as any of the via liner layer(s) 144, upper electrode layer 132, or lower electrode layer 136.

The IC die 104 in accordance with embodiments can be designed for analog signal processing or mixed signal processing. For example, the IC die 104 can include analog front end (AFE) circuitry to amplify and filter analog signals derived from the strain response material layer upon deflection of the diaphragm, and optionally also include an analog to digital converter (ADC). In the particular embodiment illustrated the IC die 104 includes a semiconductor substrate 150 (e.g., silicon, or silicon-on-insulator substrate) including various devices 152 (e.g., transistors, etc.) a back-end-of-the-line (BEOL) build-up structure 154, and electrical contact terminals 156. Electrical contact terminals 156 may be vertical interconnects, and pillar-shaped, similar to electrical contact terminals 146. In an embodiment, electrical contact terminals 156 are plated gold. The BEOL build-up structure 154 may be formed using conventional techniques and include various metal routing layers 158 and dielectric layers 160. The electrical contact terminals 146, 156 may be bonded together, for example with fusion bonding or with a solder material. The height of the electrical contact terminals 146, 156 may define cavity 118 volume and space for deflection of the diaphragm 116.

Figure 2:
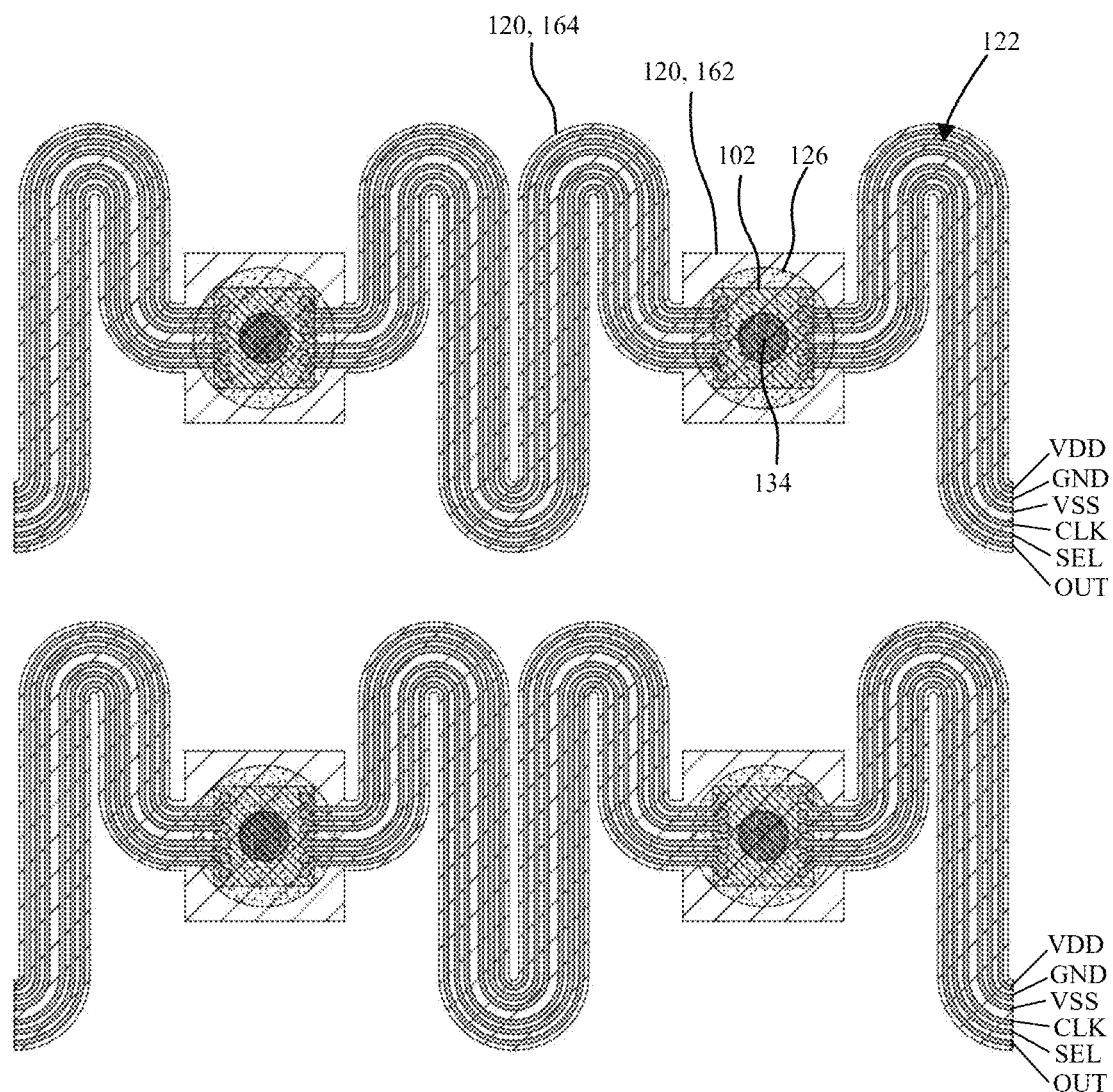
FIG. 2 is a schematic top plan view illustration of metal routing between embedded sensor packages in accordance with an embodiment.

Referring now to FIG. 2 a schematic top plan view illustration is provided of metal routing 122 between embedded sensor packages in accordance with an embodiment. As shown, each sensor package 102 can be embedded in a hub platform 162 of the planarization layer 120. The encapsulant material protrusion 126 (e.g., dome) can cover the footprint of the sensor package 102 and be fully supported by the hub platform 162. A plurality of flexible arms 164 (also stretchable) can extend from the hub platform 162. As shown, the flexible arms 164 can be formed of the planarization layer 120 and support metal routing 122 lines, though it is not required for all flexible arms to support metal routing lines. The metal routing 122 lines can be a common bus line for example carrying multiple signals lines to and from each sensor package 102, such as power 1 ("VDD," a high voltages supply), ground ("GND"), clock ("CLK"), a select line ("SEL"), a digital output ("OUT"), and/or power 2 ("VSS," a low voltage supply). The sensor packages and IC dies thereof may additionally include address circuitry to define unique addresses for each sensor in an array of serially arranged sensor packages. In some embodiments the sensor packages can be serially connected with a data output ("OUT") and generate a serial bit stream (corresponding to the sensor readings). In some embodiments the metal routing 122 lines may be an inter-integrated circuit ($I^2C$) bus, a serial peripheral interface (SPI) bus, or a system management (SM) bus that connects the sensor packages to a controller. It is to be appreciated that such an electrical arrangement is exemplary, and other configurations are envisioned in accordance with embodiments.

Figure 3A:
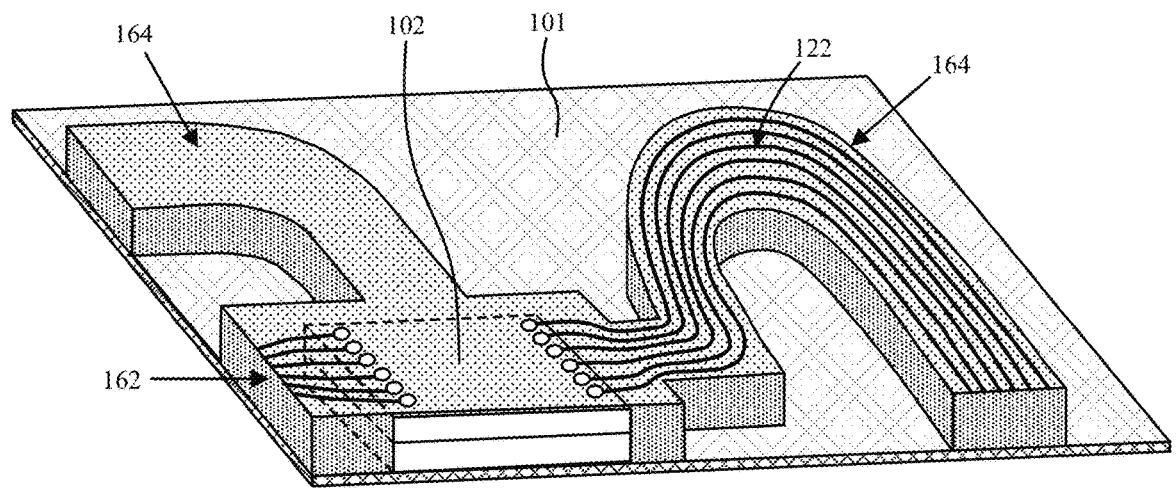
FIG. 3A is a schematic perspective cross-sectional side view illustration of an embedded sensor structure in accordance with an embodiment.

FIG. 3A is a schematic perspective cross-sectional side view illustration of an embedded sensor structure in accordance with an embodiment. Specifically, FIG. 3A is a close-up view of a sensor package 102 embedded within the hub platform 162 of the planarization layer and a plurality of flexible arms 164 (also stretchable) extending therefrom. As shown, metal routing 122 spans over a first flexible arm 164, though a second flexible arm is not supporting routing. This may be included for help achieve the web-like or mesh-like structure of connected sensor packages 102. Also shown is an optional blanket adhesive layer 101 underneath the sensor package 102 and planarization layer. The optional encapsulant material protrusion 126 (e.g., dome) structure is not illustrated for clarity.

Figure 3B:
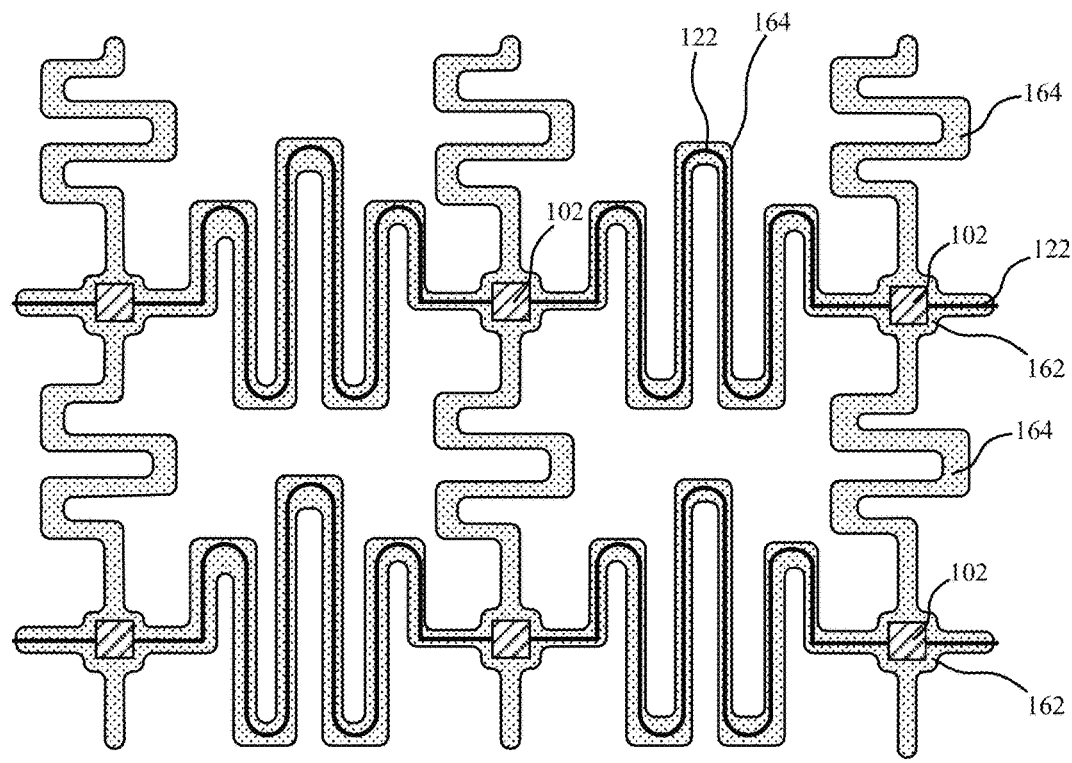
FIG. 3B is a schematic top layout view illustration of a stretchable embedded sensor film in accordance with an embodiment.
Figure 3C:
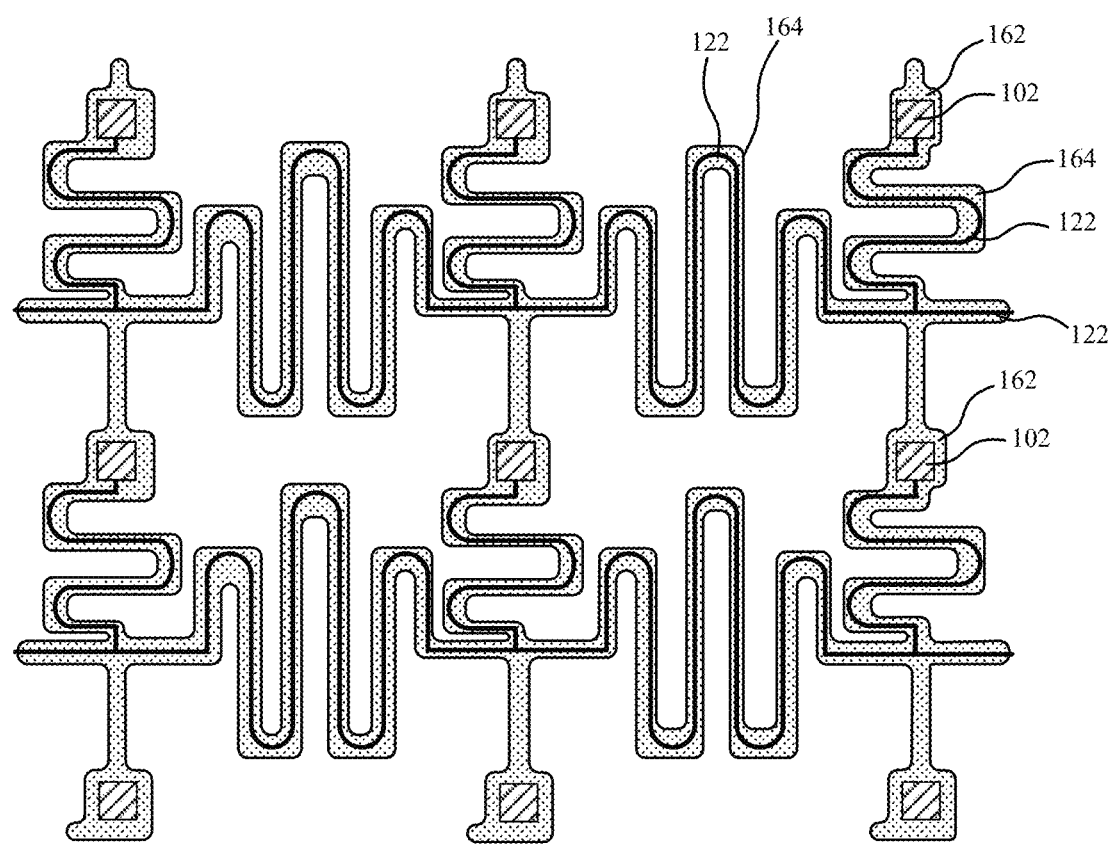
FIG. 3C is a schematic top layout view illustration of a stretchable embedded sensor film in accordance with an embodiment.

Referring now to FIGS. 3B-3C schematic top layout view illustrations are provided of a deformable, stretchable embedded sensor film in accordance with an embodiment. As illustrated the adhesive layer and encapsulant material protrusions are not illustrated for clarity. In the embodiment illustrated in FIG. 3B the metal routing 122 lines are both input and output from each sensor package 102 in a daisy chain fashion, similar to FIG. 2 and FIG. 3A. In another embodiment illustrated in FIG. 3C the number of connections to each sensor package 102 can be reduced, though metal routing 122 line density may be increased, with each sensor package 102 including a specified input/output.

In the following description reference is made to various sequences and illustrations for forming embedded sensor structure in accordance with embodiments. In interest of clarity and conciseness various features described and illustrated with regard to FIG. 1 are not separately referenced or described, though it is to be appreciated that many features already described and illustrated may also be included in the following sequences and referenced figures.

Figure 4A:
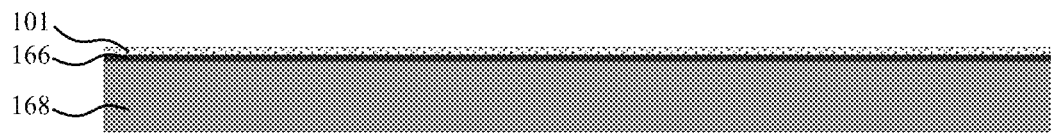
FIGS. 4A-4G are schematic cross-sectional side view illustrations of a sequence of forming an embedded sensor structure in accordance with an embodiment.

FIGS. 4A-4G are schematic cross-sectional side view illustrations of a sequence of forming an embedded sensor structure in accordance with an embodiment. As shown in FIG. 4A, the fabrication sequence may begin with forming a release layer 166 (lift-off layer) over a carrier substrate 168. The carrier substrate 168 may be any substrate that can provide support for the assembly process, including glass, metal, semiconductor wafer, etc. The lift-off layer can be a variety of materials, such as a metal film, amorphous silicon, etc. This can be followed by application of an adhesive layer 101 over the release layer 166. The adhesive layer 101 may be polymer glue material, such as a B-staged polymer in an embodiment.

Figure 4B:
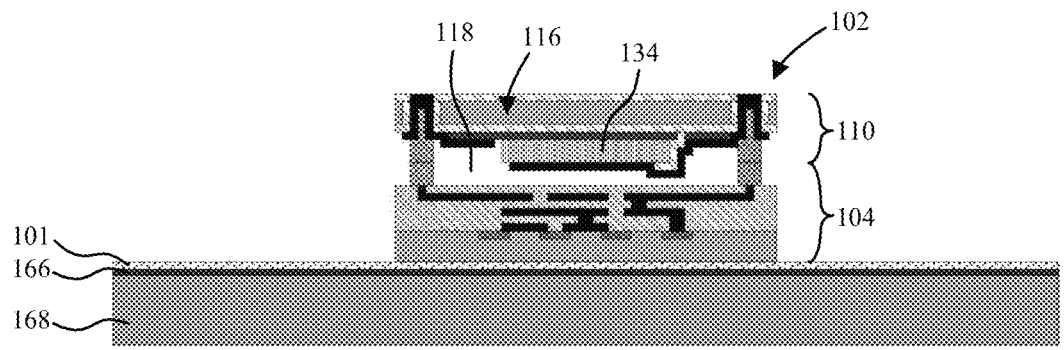
Figure 4C:
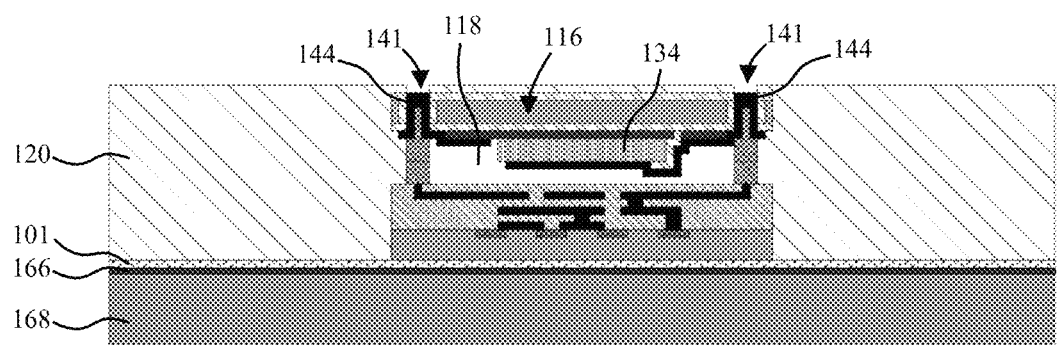
Figure 4D:
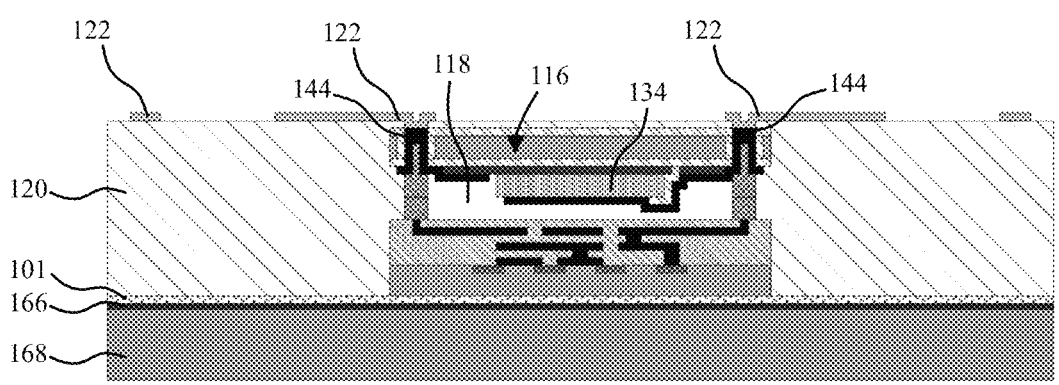

A plurality of sensor packages 102 can then be placed onto the adhesive layer 101 as shown in FIG. 4B with back sides 108 of the IC dies 104 placed onto the adhesive layer 101. A planarization layer 120 is then applied as shown in FIG. 4C. The planarization layer 120 may be spun on or slot-die coated for example and levels or planarizes the structure around the adhesively bonded sensor packages 102. The planarization layer 120 provides a base on which metal routing can be patterned that is nominally level with minimal topography, though the planarization layer 120 may also span over a top surface of the sensor package or not cover the top surface of the sensor package. The planarization layer 120 may be a photo-sensitive polymer that can be patterned with a mask or etched with an appropriate plasma chemistry. In an embodiment, a thickness of the planarization layer 120 can be removed to less than 10 microns in thickness in the region above the sensing area (e.g., diaphragm area and/or strain response material area) in order to minimize added stiffness to the sensor, which could potentially reduce sensitivity. A plurality of contact openings 141 can then optionally be formed in the planarization layer 120 to expose the via interconnects 145, such as the via liner layers 144 thereof.

Metal routing 122 can then be formed over the planarization layer 120, and on the via interconnects 145, such as the via liner layers 144 thereof. The metal routing 122 can be formed using suitable techniques. For example, the metal routing can be deposited by physical vapor deposition and subsequently etched with a photoresists mask, lifted-off by depositing over a lift-off photoresist, or plated with a seed layer. The metal routing 122 may include one or more metal layers. For example, metal routing 122 may include copper or gold for low resistivity, high ductility, and ability to withstand large strain.

Figure 4E:
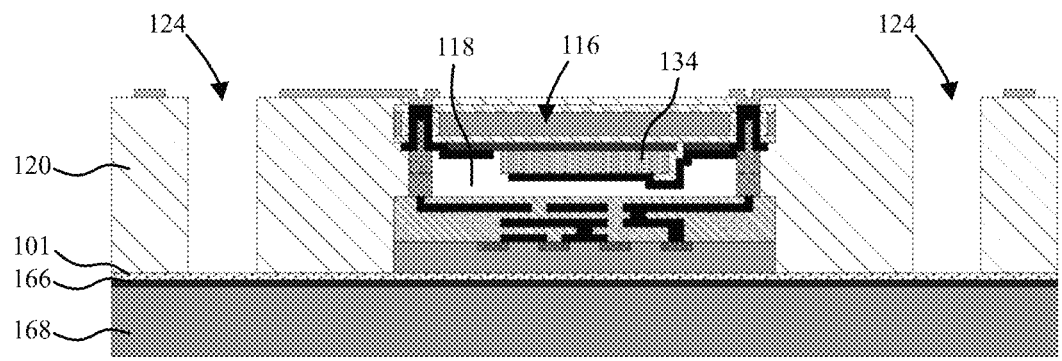

A pattern of strain relief trenches 124 can then be formed through the planarization layer 120 as shown in FIG. 4E. A variety of patterns can be formed depending upon flexibility and stretchability specifications for end product. The strain relief trenches 124 can define the flexible arms 164 and hub platforms 162 as previously described. The strain relief trenches 124 may be completely or partially formed through the planarization layer 120 and may end over the adhesive layer 101, release layer 166, or carrier substrate 168. Encapsulant material protrusions 126 can also be formed prior to patterning the strain relief trenches 124.

Figure 4F:
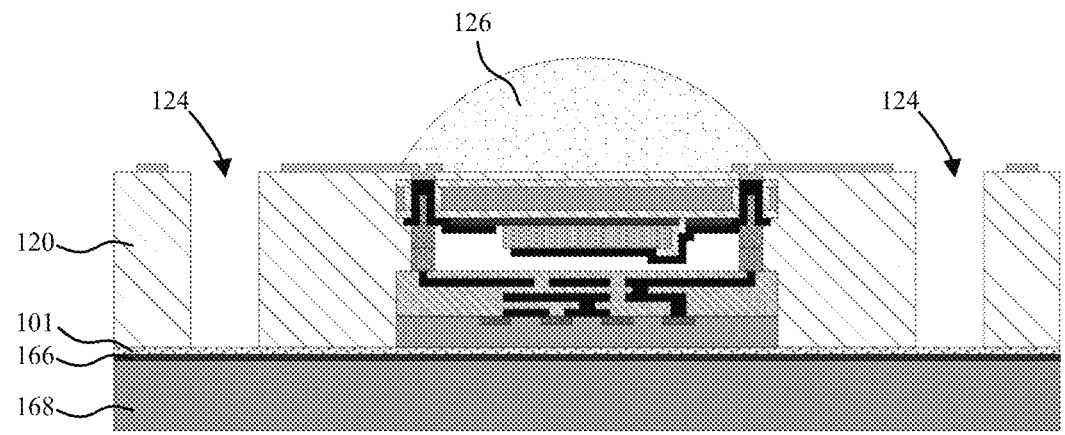
Figure 4G:
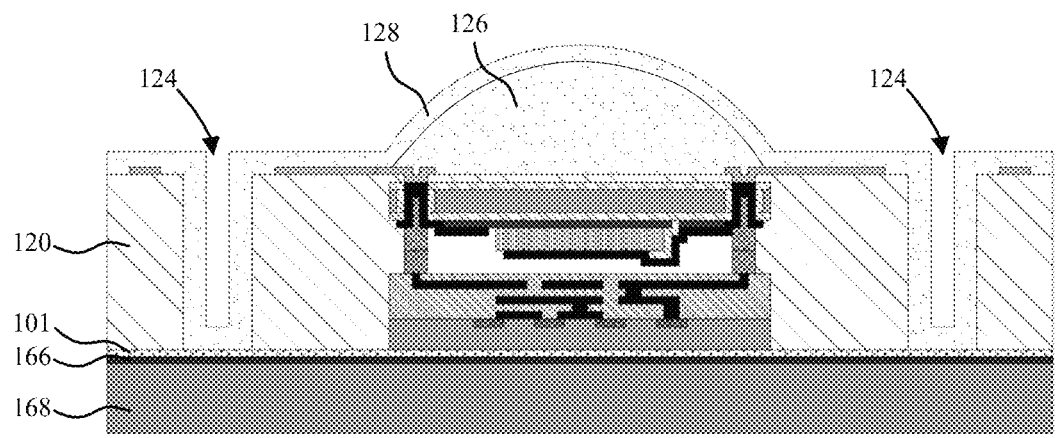

Referring now to FIG. 4F a plurality of encapsulant material protrusions 126 can then be formed over the respective sensor packages 102. For example, the encapsulant material protrusions 126 can be formed by a dispensing technique such as ink jet printing, casting or spray coating to form a determined shape such as dome or cylinder that can provide a source to focus external applied force to the sensor region. The encapsulant material protrusions 126 can be formed of a low modulus of elasticity material such a urethane, silicone, or equivalent polymer. Encapsulation layer 128 can then optionally be formed as shown in FIG. 4G. The encapsulation layer 128 can be formed of the same or different material than the encapsulant material protrusions 126, and may be formed during the same or subsequent operation. As shown, the encapsulation layer 128 can be globally applied so that a uniform layer is formed over the underlying topography, including within the strain relief trenches 124.

Following application of the optional encapsulation layer 128 the carrier substrate can then be removed. For example, the stack-up beginning with the adhesive layer 101 can be peeled from the release layer 166 or otherwise separated from the release layer 166 to render a stretchable embedded sensor film that can be further integrated into a variety of applications. For example, the stretchable embedded sensor film can be coupled with an article, such as a wearable device (e.g., a glove, sleeve, or shoe) or other system providing localized control (e.g., a seat or dashboard).

It is to be appreciated that the particular integration sequences can be varied depending upon sensor package 102 structure as well as sensitivity requirements for the end application.

Figure 5A:
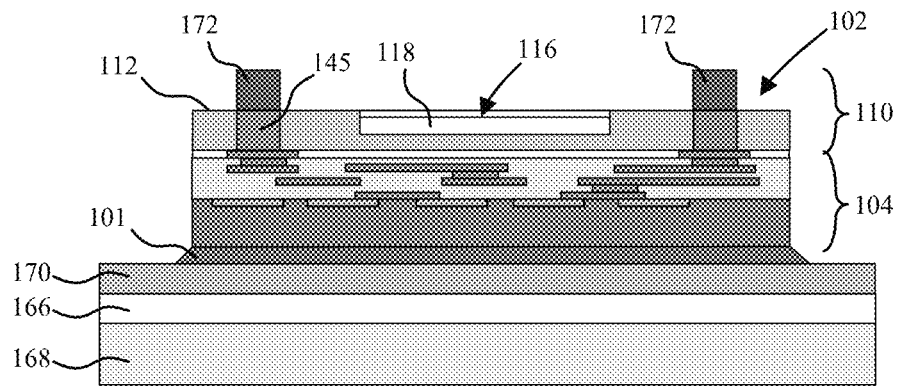
FIGS. 5A-5F are schematic cross-sectional side view illustrations of a sequence of forming an embedded sensor structure in accordance with an embodiment.

FIGS. 5A-5F are schematic cross-sectional side view illustrations of a sequence of forming an embedded sensor structure in accordance with an embodiment. As shown in FIG. 5A a sensor package 102 can be mounted onto a carrier substrate 168. In the particular embodiment illustrated a release layer 166 is formed over the carrier substrate 168, and a support layer 170 is further formed over the release layer 166. The support layer 170 can be a thin layer that is released with the stretchable embedded sensor film end product. For example, the support layer 170 can be a thin polymer or glass layer. In an embodiment, the support layer 170 is a polyimide layer. In the particular embodiment illustrated the sensor package 102 (which may be one of a plurality) is bonded to the support layer 170 with an adhesive layer 101. The adhesive layer may be locally applied (e.g., prior to mounting the sensor package, or as part of the sensor package) or globally applied. In the particular embodiment illustrated in FIG. 5A a plurality of stud bumps 172 protrude from the top side 112 of the sensor die 110. Stud bumps 172 can be in electrical connection with the via interconnects 145 and may be formed similarly as electrical contact terminals 146, 156.

Figure 5B:
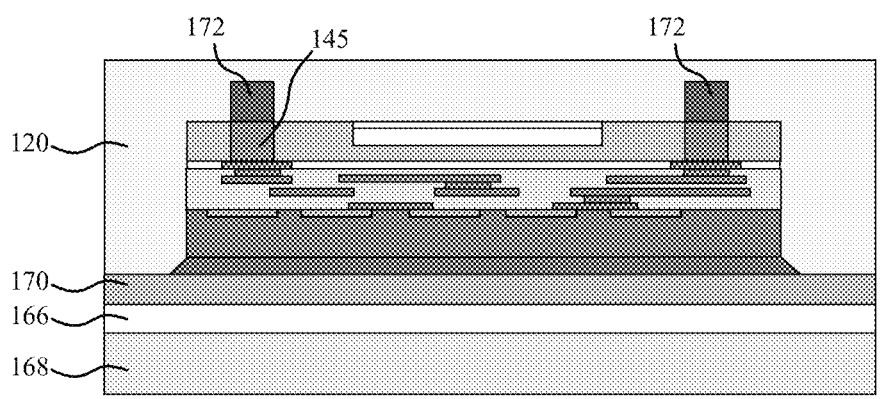
Figure 5C:
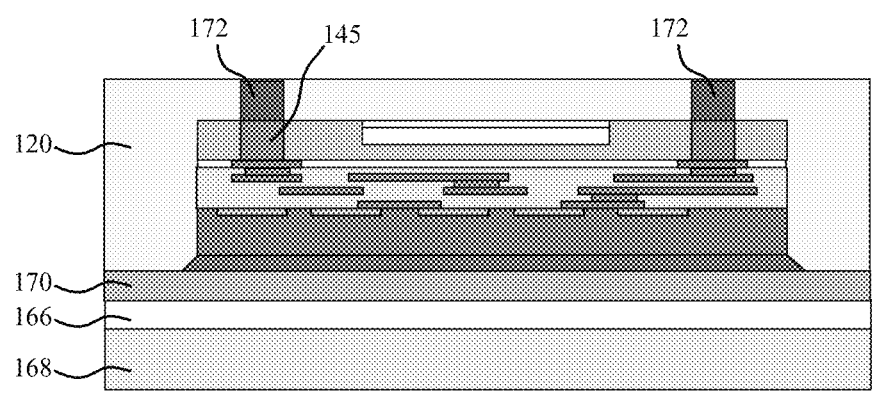

Planarization layer 120 may then be applied as shown in FIG. 5B to laterally surround the sensor package(s). The planarization layer 120 may be spun on or slot-die coated for example and levels or planarizes the structure around the adhesively bonded sensor packages 102. The planarization layer 120 provides a base on which metal routing can be patterned that is nominally level with minimal topography. The planarization layer 120 may be a photo-sensitive polymer that can be patterned with a mask or etched with an appropriate plasma chemistry. The planarization layer 120 can then be treated, such as with chemical mechanical polishing (CMP) and or plasma cleaning to clear planarization layer 120 residue from over the stud bumps 172 and to expose the stud bumps 172 as shown in FIG. 5C for each sensor package.

Figure 5D:
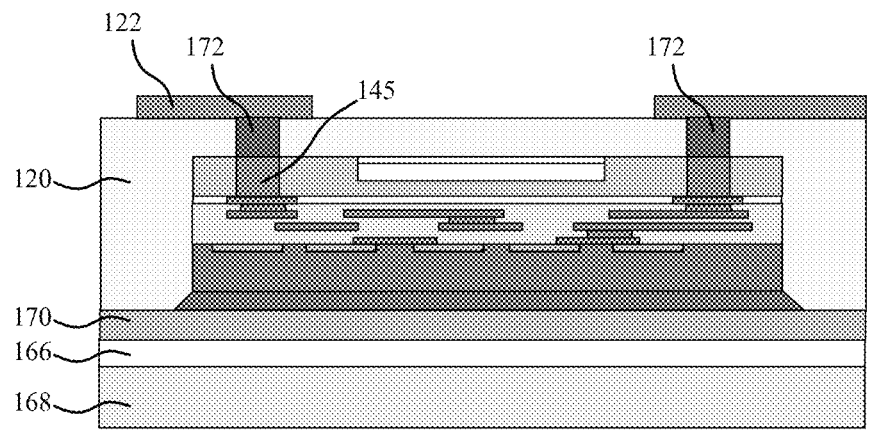

Referring to FIG. 5D, metal routing 122 can then be formed over the planarization layer 120, and on the stud bumps 172. The metal routing 122 can be formed using suitable techniques. For example, the metal routing can be deposited by physical vapor deposition and subsequently etched with a photoresists mask, lifted-off by depositing over a lift-off photoresist, or plated with a seed layer. The metal routing 122 may include one or more metal layers. For example, metal routing 122 may include copper or gold for low resistivity, high ductility, and ability to withstand large strain. While not illustrated, a pattern of strain relief trenches 124 can then optionally be formed through the planarization layer 120 stopping on either adhesive layer 101 if globally applied or support layer 170.

Figure 5E:
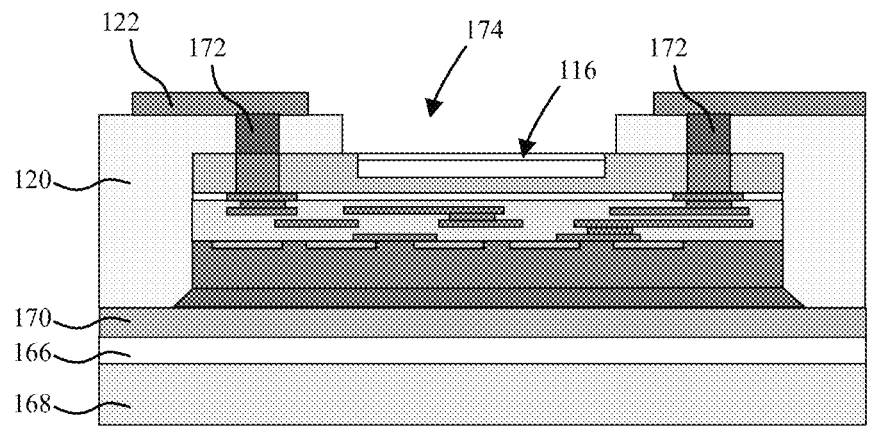
Figure 5F:
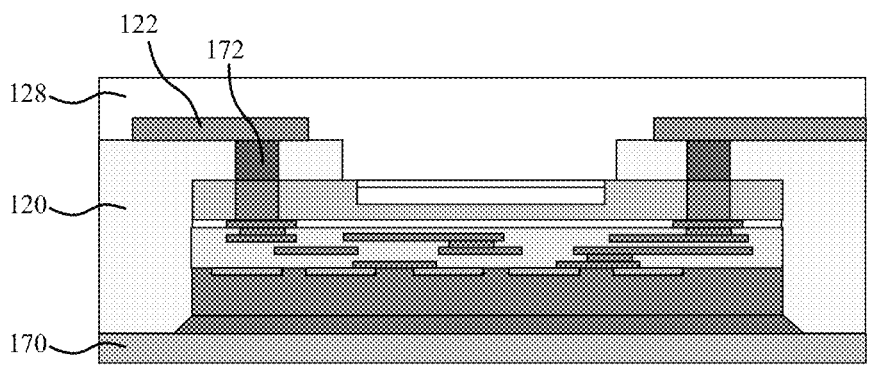

The planarization layer 120 may then be optionally patterned as shown in FIG. 5E to form a plurality of openings 174 over the plurality of sensor packages 102, and more specifically over the sensing areas of the sensor packages which may correspond to the diaphragm and/or strain response material area. For example, the openings 174 may expose the plurality of sensor packages 102 to clear the planarization layer 120 from the sensing areas (e.g., from over the diaphragms 116) of the sensor packages 102. This may be followed deposition of an encapsulation layer 128, and removal of the stretchable embedded sensor film from the carrier substrate 168 and release layer 166 as shown in FIG. 5F. While not illustrated, an encapsulant material protrusion 126 can also be deposited over each sensor package 102 as previously described and illustrated prior to formation of the encapsulation layer 128, during, or after formation of the encapsulation layer 128.

Figure 6:
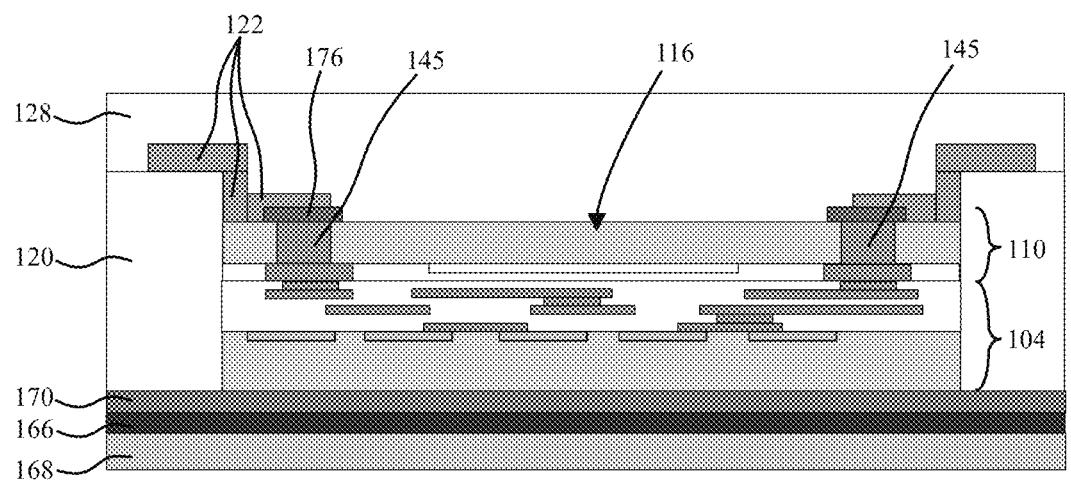
FIG. 6 is a schematic cross-sectional side view illustration of an embedded sensor structure in accordance with an embodiment.

FIG. 6 is a schematic cross-sectional side view illustration of an embedded sensor structure in accordance with an embodiment. In particular FIG. 6 illustrates a further manufacturing variation. The fabrication sequence utilized to arrive at the embedded sensor structure illustrated in FIG. 6 is substantially similar to that illustrated in FIGS. 5A-5F without the inclusion of stud bumps 172. In such a fabrication sequence the metal routing 122 can be formed after the formation of openings 174 to expose the plurality of sensor packages 102, and more specifically over the sensing areas of the sensor packages which may correspond to the diaphragm and/or strain response material area. As such, the metal routing 122 can span along the top side of the planarization layer 120 and into the openings 174 to contact the top sides of the sensor packages 102. Specifically, the metal routing 122 can contact metal landing pads 176 (e.g., gold) on top of the via interconnects 145, which may also be part of the via interconnects 145.

In each of the foregoing sequences the embedded sensor structure can be removed from the carrier substrate 168 with or without the support layer 170 and/or adhesive layer(s) 101 as stretchable embedded sensor film that can then be further integrated with an article of a sensing system.

Figure 7:
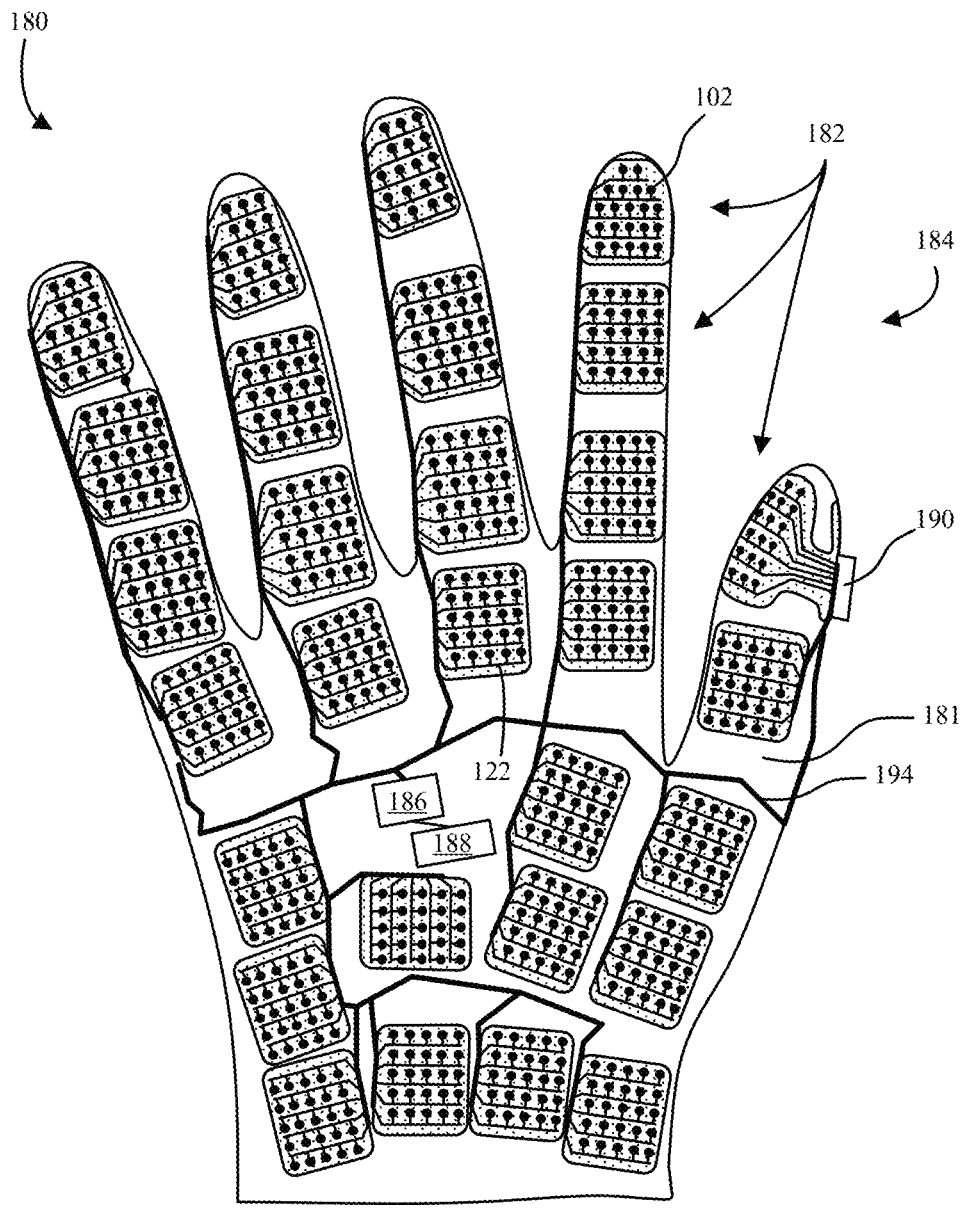
FIG. 7 is a schematic layout view illustration of a sensing system including a plurality of stretchable embedded sensor films in accordance with an embodiment.

FIG. 7 is a schematic layout view illustration of a sensing system 180 including a plurality of stretchable embedded sensor films 182 in accordance with an embodiment. The sensing system 180 may perform an integrated readout of sensor packages 102 (sensors) as described herein. The stretchable embedded sensor films 182 may be integrated with an article surface 181 of article 184 which may be deformable with the film and/or have relatively limited space. For example, the sensing system 180 may be a wearable system that is integrated with a sensing glove worn by a user. The stretchable embedded sensor films 182 may include, for example, 1,000 sensors, 10,000 sensors, or more, integrated with the article 184. Each stretchable embedded sensor films 182 may include a plurality of sensor packages 102 arranged in a location of the article 184. For example, a first stretchable embedded sensor films 182 may correspond to a first group of 10 sensors, 100 sensors, or more, arranged at a first finger or fingertip of the sensing glove, a second stretchable embedded sensor films 182 may correspond to a second group of 10 sensors, 100 sensors, or more, arranged at a second finger or fingertip of the sensing glove, and so forth.

The sensing system 180 may include a controller 186 (another IC, such as an application-specific integrated circuit (ASIC) or field-programmable gate array (FPGA)) connected to the plurality of stretchable embedded sensor films 182 and to a communication device 188 with wiring 194. For example, the stretchable embedded sensor films 182 and sensors packages 102 could be on a palmar side of a sensing glove, and the controller 186 and the communication device 188 could be on the palmar side or a dorsal side of the sensing glove. The stretchable embedded sensor films 182 can be exterior facing to an environment or internally facing to a user, or both. The controller 186 and communication device 188 are illustrated as being on the palmar side in FIG. 7 for illustrative purposes, though may also or alternatively be located on the dorsal side of the sensing glove, on a thumb, etc. The controller 186 may connect directly and/or indirectly to the plurality of stretchable embedded sensor films 182 and the sensor packages 102 thereof. For example, in some cases, the controller 186 may connect directly to the plurality of stretchable embedded sensor films 182 and sensor packages 102 thereof, and in other cases, the controller 186 may be a global controller connected to one or more local controllers that are connected to the plurality of stretchable embedded sensor films 182 and the sensor packages 102 thereof. For example, the controller 186 could connect to a local controller 190 (e.g., another IC, such as an ASIC or FPGA) arranged on a section of the article 184 (e.g., a dorsal side of a thumb of the sensing glove). The local controller 190, in turn, may connect to sensor packages 102 of one or more stretchable embedded sensor films 182 in the section (e.g., the thumb). The local controller 190 can process outputs (e.g., digital outputs) from sensor packages 102 in the section to generate a compressed bitstream for the controller 186. In some implementations, the controller 186 may be a hybrid controller operating as both a global controller (e.g., connected to local controllers arranged in some sections of the article 184) and a local controller (e.g., connected directly to sensor packages 102 in other sections of the article 184).

In operation the controller 186 can cause one or more sensor packages 102 of one or more stretchable embedded sensor films 182 to each transmit an output. In some cases, the controller 186 can directly cause transmission of an output from a sensor package 102, such as by sending an input to trigger a sensor package 102. In other cases, the controller 186 can indirectly cause transmission of an output from a sensor package 102, such as by causing a local controller to send an input to trigger a sensor package 102, and/or by causing one sensor package 102 to send an output to trigger another sensor package 102.

The communication device 188 may enable transmission of a collection of data from sensor packages 102 to another system. The communication device 188 may utilize wired or wireless connections, such as universal serial bus (USB), low-voltage differential signaling (LVDS), serial peripheral interface (SPI), Bluetooth, or Ethernet, to transmit the digital data. For example, the controller 186 can receive outputs from the sensor packages 102 based on triggering those sensor packages, then utilize the communication device 188 to transmit a compressed bitstream encoding the outputs to another system, such as a host computer or server. As a result, the controller 186 can selectively perform readout of sensor packages 102 of stretchable embedded sensor films 182 in the sensing system 180 to obtain sensing information relatively fast and with high resolution.

Figure 8:
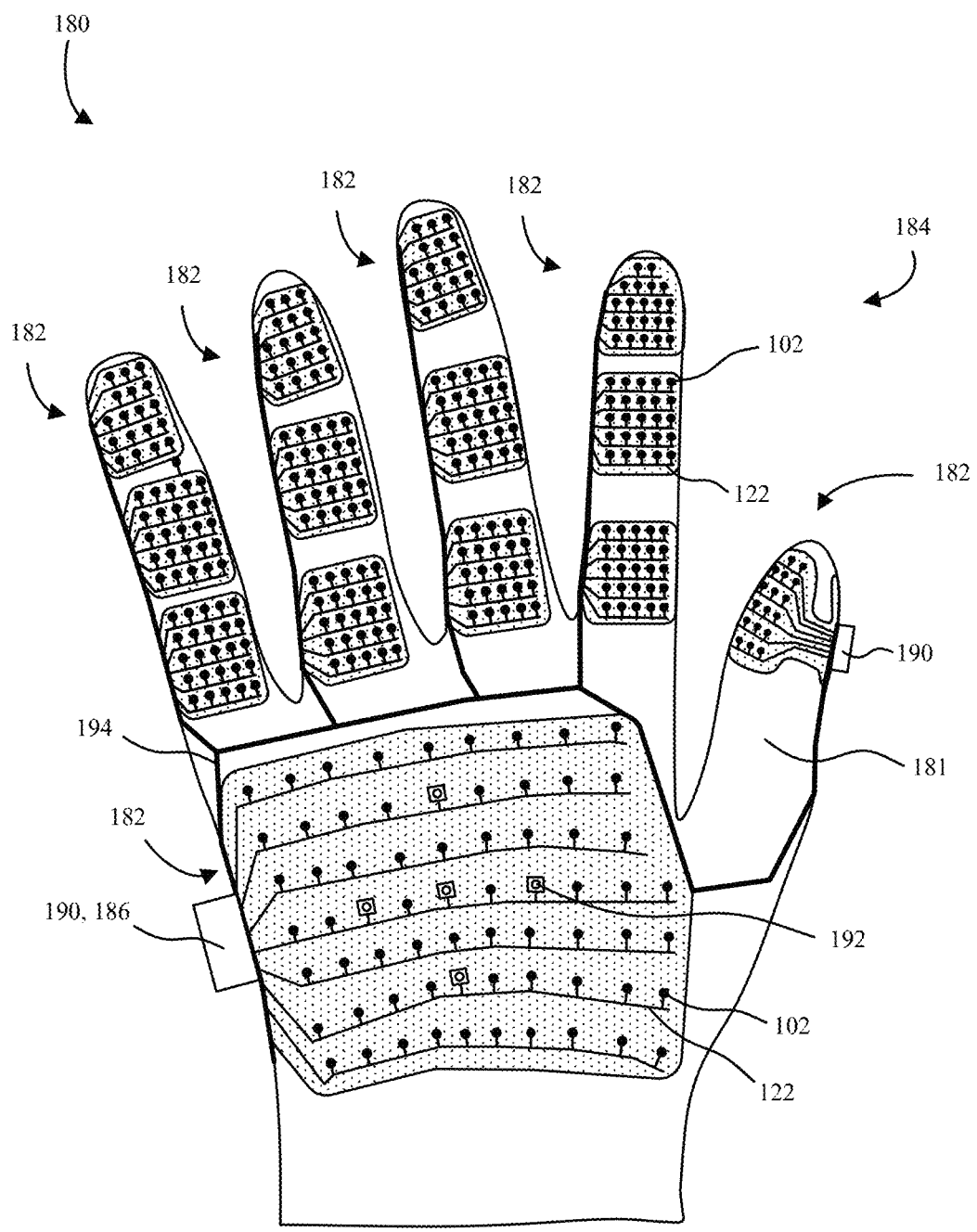
FIG. 8 is a schematic layout view illustration of a sensing system including a plurality of stretchable embedded sensor films in accordance with an embodiment.

FIG. 8 is a schematic layout view illustration of a sensing system 180 including a plurality of stretchable embedded sensor films 182 in accordance with an embodiment. The sensing system 180 of FIG. 8 is substantially similar to that illustrated in FIG. 7, though illustrates that stretchable embedded sensor films 182 of different size and pitch of sensor packages 102 can be integrated. In some implementations, sensor packages 102 within stretchable embedded sensor films 182 coupled with some regions of the article (see the stretchable embedded sensor film 182 located on the palmar area) may have an increased or decreased pitch compared to sensor packages 102 in stretchable embedded sensor films 182 coupled with other regions of the article. For example, sensor packages 102 in the stretchable embedded sensor films 182 coupled with finger tip regions or other finger regions may have a smaller pitch (e.g., a closer spacing between sensors), such as 2 mm or less or 1 mm or less, while sensor packages 102 coupled with the palm may have a greater pitch (e.g., a further spacing between sensors), such as greater than 1 mm, 2 mm, 3 mm, or 5 mm or more. Sensor package 102 pitch across a stretchable embedded sensor film 182 can be constant, or may be graded for example, from a tighter to coarser pitch for example, and vice versa. Sensor package 102 pitch can also be varied at specific locations to facilitate the inclusion of additional device or alternative sensors. For example, one or more cameras 192 may be dispersed within the sensor package 102 arrays. One or more cameras 192 may be utilized to detect color data (e.g., RGB) and/or depth data (e.g., spatial orientation) of objects while performing a task.

In other applications, the sensing system 180 including the plurality of stretchable embedded sensor films 182 may be coupled to upholstery, sleeves, shoes, chairs, etc., and/or may be integrated with large area tactile input surfaces, such as a curved vehicle dashboard, having software-reconfigurable buttons, switches, and/or dials.

In utilizing the various aspects of the embodiments, it would become apparent to one skilled in the art that combinations or variations of the above embodiments are possible for forming an embedded sensor structure and stretchable embedded sensor film. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An embedded sensor structure comprising:
    a sensor package including:
        an integrated circuit (IC) die including a front side and a back side; and
        a sensor die including a top side and a bottom side that is bonded to the front side of the IC die;
        wherein the sensor die includes a diaphragm that is deflectable toward a cavity;
    a planarization layer laterally surrounding the sensor package; and
    a metal routing to the top side of the sensor die, the metal routing spanning over the planarization layer.

2. The embedded sensor structure of claim 1, further comprising an encapsulant material protrusion directly over the sensor package to provide a localized contact surface.

3. The embedded sensor structure of claim 1, wherein the sensor die comprises a strain response material layer on the diaphragm, and between the diaphragm and the IC die.

4. The embedded sensor structure of claim 3, wherein the IC die comprises:
    analog front end (AFE) circuitry to amplify and filter analog signals derived from the strain response material layer upon deflection of the diaphragm; and
    an analog to digital converter (ADC).

5. The embedded sensor structure of claim 3, wherein the sensor die includes a silicon substrate, and a plurality of via interconnects that electrically couple the IC die and the strain response material layer to the metal routing on the top side of the sensor die.

6. The embedded sensor structure of claim 5, wherein the sensor die has a maximum lateral dimension of 300 μm or less.

7. The embedded sensor structure of claim 1, further comprising a pattern of strain relief trenches through the planarization layer.

8. The embedded sensor structure of claim 7, wherein the pattern of strain relief trenches forms a plurality of serpentine patterns in the planarization layer laterally adjacent to the sensor package.

9. The embedded sensor structure of claim 8, wherein the metal routing spans over one or more of the plurality of serpentine patterns.

10. The embedded sensor structure of claim 9, wherein the planarization layer, sensor package, and metal routing are part of a stretchable embedded sensor film, and the stretchable embedded sensor film is coupled with an article.

11. The embedded sensor structure of claim 10, wherein the article is selected from a group consisting of a glove, upholstery, a sleeve, and a shoe.

12. A stretchable embedded sensor film comprising:
    a plurality of sensor packages embedded in a planarization layer laterally surrounding the plurality of sensor packages;
    wherein each sensor package includes;
        an integrated circuit (IC) die including a front side and a back side; and
        a sensor die including a top side and a bottom side that is bonded to the front side of the IC die;
        wherein the sensor die includes a diaphragm that is deflectable toward a cavity; and
    a metal routing spanning over the planarization layer and the top sides of the plurality of sensor dies.

13. The stretchable embedded sensor film of claim 12, further comprising a plurality of separate encapsulant material protrusions directly over the plurality of sensor packages to provide localized contact surfaces.

14. The stretchable embedded sensor film of claim 12, wherein the sensor die comprises a strain response material layer on the diaphragm, and between the diaphragm and the IC die.

15. The stretchable embedded sensor film of claim 14, wherein the IC die comprises:
- analog front end (AFE) circuitry to amplify and filter analog signals derived from the strain response material layer upon deflection of the diaphragm; and
- an analog to digital converter (ADC).

16. The stretchable embedded sensor film of claim 14, wherein the sensor die includes a silicon substrate, and a plurality of via interconnects that electrically couple the IC die and the strain response material layer to the metal routing on the top side of the sensor die.

17. The stretchable embedded sensor film of claim 12, wherein the sensor packages of the plurality of sensor packages are arranged with a pitch of 2 mm or less, and each sensor package has a maximum lateral dimension of 1,000 µm or less.

18. The stretchable embedded sensor film of claim 12, further comprising a pattern of strain relief trenches through the planarization layer.

19. The stretchable embedded sensor film of claim 18, wherein the pattern of strain relief trenches forms a plurality of hub platforms in the planarization layer laterally surrounding the plurality of sensor packages, and a plurality of flexible arms extending from the plurality of hub platforms.

20. The stretchable embedded sensor film of claim 19, wherein the metal routing spans over one or more of the plurality of flexible arms.

21. The stretchable embedded sensor film of claim 12, further comprising a separate adhesive layer underneath each sensor package, wherein the planarization layer laterally surrounds each separate adhesive layer.

* * * * *